(12) United States Patent
Ha

(10) Patent No.: US 9,105,575 B2
(45) Date of Patent: Aug. 11, 2015

(54) METHOD FOR FABRICATING A SEMICONDUCTOR DEVICE

(71) Applicant: SK HYNIX INC., Icheon (KR)

(72) Inventor: Tae-Jung Ha, Icheon (KR)

(73) Assignee: SK HYNIX INC., Icheon (KR)

( * ) Notice: Subject to any disclaimer, the term of this patent is extended or adjusted under 35 U.S.C. 154(b) by 150 days.

(21) Appl. No.: 13/972,793

(22) Filed: Aug. 21, 2013

(65) Prior Publication Data

US 2014/0308796 A1 Oct. 16, 2014

(30) Foreign Application Priority Data

Apr. 10, 2013 (KR) .......................... 10-2013-0039101

(51) Int. Cl.
*H01L 21/20* (2006.01)
*H01L 27/24* (2006.01)
*H01L 45/00* (2006.01)

(52) U.S. Cl.
CPC ............ *H01L 27/2463* (2013.01); *H01L 45/06* (2013.01); *H01L 45/08* (2013.01); *H01L 45/085* (2013.01); *H01L 45/1233* (2013.01); *H01L 45/144* (2013.01); *H01L 45/146* (2013.01); *H01L 45/147* (2013.01); *H01L 45/1625* (2013.01)

(58) Field of Classification Search
CPC ................... C12Q 2563/143; C12Q 2565/633; C12Q 1/6895; C12Q 2563/155; C12Q 1/6825; C12Q 1/6827; C12Q 1/6816; C12Q 2537/125; C12Q 2565/113; C12Q 1/6813; C12Q 1/689; C12Q 1/70; C12Q 1/701
See application file for complete search history.

(56) References Cited

U.S. PATENT DOCUMENTS

2012/0258595 A1 10/2012 Lazovsky et al.

FOREIGN PATENT DOCUMENTS

KR 10-2012-0020265 A 3/2012

*Primary Examiner* — Robert Bachner

(57) ABSTRACT

A method for fabricating a semiconductor device includes: forming first lines having a hydrophobic surface extending parallel to each other in a direction between first insulation layers having a hydrophilic surface; self-aligning hydrophilic particles over the first insulation layers to expose portions of the first lines at predetermined intervals; forming a plurality of variable resistance elements over the exposed portions of the first lines; and removing the particles.

11 Claims, 18 Drawing Sheets

METHOD FOR FABRICATING A SEMICONDUCTOR DEVICE

CROSS-REFERENCE TO RELATED APPLICATION

The present application claims priority of Korean Patent Application No. 10-2013-0039101, filed on Apr. 10, 2013, which is incorporated herein by reference in its entirety.

BACKGROUND

1. Field of the Invention

The present disclosure relates to a method for fabricating a semiconductor device, and more particularly, to a method for fabricating a semiconductor device having a variable resistance layer which switches between two or more different resistance states as the resistance thereof is changed according to an applied voltage or current.

2. Description of the Related Art

A variable resistance memory device, of which resistance is changed according to an external stimulus, switches between two or more resistance states so as to store data. Variable resistance memory devices include, for example, a resistive random access memory (ReRAM), a phase change RAM (PCRAM), a spin transfer torque-RAM (STT-RAM), and the like. Critically, variable resistance memory devices have a simple structure yet provide a number of desirable characteristics such as nonvolatility. Thus, a large amount of research has been conducted on variable resistance memory devices.

Among variable resistance memory devices, ReRAM has a structure that includes a variable resistance material, for example, a variable resistance layer formed of a perovskite-based material or transition metal oxide, and electrodes over and under the variable resistance layer. When a voltage is applied to the electrodes, a filament-shaped current path is formed or is absent in the variable resistance layer. Thus, when the filament-shaped current path is formed, the variable resistance layer is set in a low resistance state, and when the filament-shaped current path is absent, the variable resistance layer is set in a high resistance state.

SUMMARY

Various embodiments are directed to methods for fabricating a semiconductor device that simplify fabrication, reduce costs, and fundamentally prevent etch damage by forming micro patterns without a photolithography process or an etch process.

In an embodiment, a method for fabricating a semiconductor device includes: forming first lines having a hydrophobic surface extending parallel to each other in a direction between first insulation layers having a hydrophilic surface; self-aligning hydrophilic particles over the first insulation layers to expose portions of the first lines at predetermined intervals; forming a plurality of variable resistance elements over the exposed portions of the first lines; and removing the particles.

In an embodiment, a method for fabricating a semiconductor device includes: forming first lines having a hydrophobic surface extending parallel to each other in a direction between first insulation layers having a hydrophilic surface; self-aligning first hydrophilic particles over the first insulation layers to expose portions of the first lines at predetermined intervals; forming a first material layer over the exposed portions of the first lines; removing the first hydrophilic particles to leave the first material layer over the exposed portions of the first lines; self-aligning second hydrophilic particles over the first insulation layers where the first hydrophilic particles were removed; forming a second material layer over the first material layer; removing the second hydrophilic particles to leave the second material layer over the first material layer; self-aligning third hydrophilic particles over the first insulation layers where the second hydrophilic particles were removed; forming a third material layer over the second material layer; and removing the third hydrophilic particles to leave the third material layer over the first and second material layers, the first, second, and third material layers forming a plurality of variable resistance elements.

DETAILED DESCRIPTION

Figure 1A:
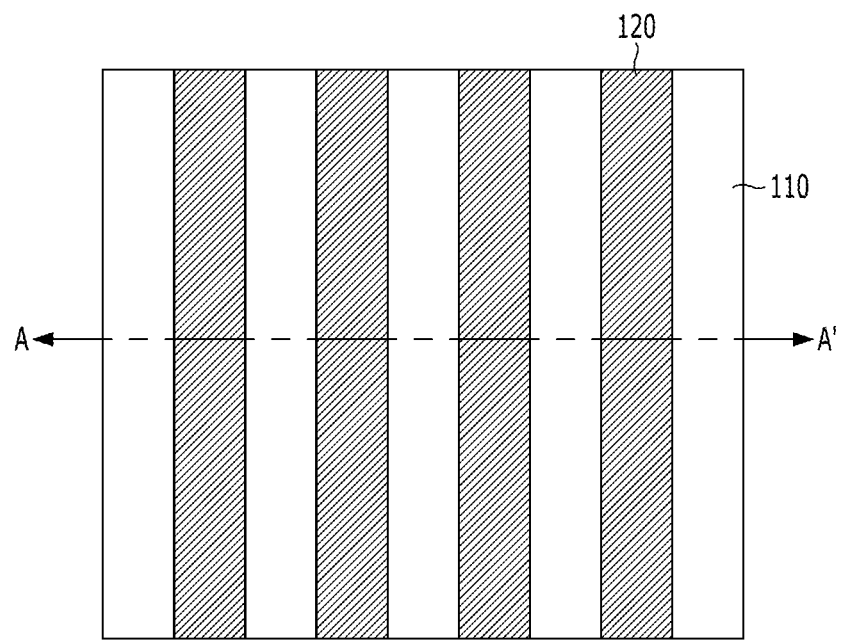
FIGS. 1A to 7B are diagrams illustrating a method for fabricating a semiconductor device in accordance with a first embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 7B are diagrams illustrating sequential process steps of a method for fabricating a semiconductor device in accordance with a first embodiment of the present invention. FIGS. 1A to 7A are plan views illustrating the layout, and FIGS. 1B to 7B are cross-sectional views taken along lines A-A' of FIGS. 1A to 7A, respectively.

Figure 1B:
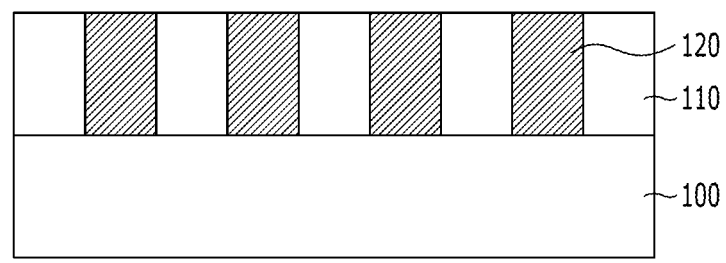

Referring to FIGS. 1A and 1B, a first insulation layer 110 is formed over a substrate 100 having a predetermined lower structure (not illustrated). The substrate 100 may comprise a silicon (Si) substrate, a germanium (Ge) substrate, a silicon-germanium (SiGe) substrate, a silicon-on-insulator (SOI) substrate, or the like. Although not illustrated in FIG. 1B, the substrate 100 may include peripheral circuits for driving the semiconductor device. In an embodiment, the first insulation layer 110 comprises an insulator having a hydrophilic surface such as an oxide-based material. The first insulation layer 110 may be formed by depositing the oxide-based material, such as silicon oxide ($SiO_2$), on the substrate 100.

The first insulation layer 110 is selectively etched to form trenches therein, and thereafter first lines 120 are formed within the trenches. The first lines 120 each comprise a conductive material having a hydrophobic surface. The conductive material may comprise a metal such as tantalum (Ta), titanium (Ti), ruthenium (Ru), hafnium (Hf), zirconium (Zr), aluminum (Al), tungsten (W), copper (Cu), gold (Au), silver (Ag), platinum (Pt), nickel (Ni), chrome (Cr), or cobalt (Co); a metal nitride such as titanium nitride (TiN), tantalum nitride (TaN), or tungsten nitride (WN); or combinations thereof. The first lines 120 may be formed by depositing the conductive material having a hydrophobic surface within the trenches.

In an embodiment, the first lines 120 are formed according to the following process: the above-described conductive material is deposited in an amount sufficient to fill the trenches and a planarization process such as chemical mechanical polishing (CMP) is performed until a first surface of the first insulation layer 110 is exposed. In this way, the first lines 120 and the first insulation layer 110 extend parallel to one another. In certain embodiments, since the size of hydrophilic particles to be described below is very small, the widths of the first lines 120 and the first insulation layer 110 may be 15 nm or less so as to allow assembly of the variable resistance elements as described below.

Figure 2A:
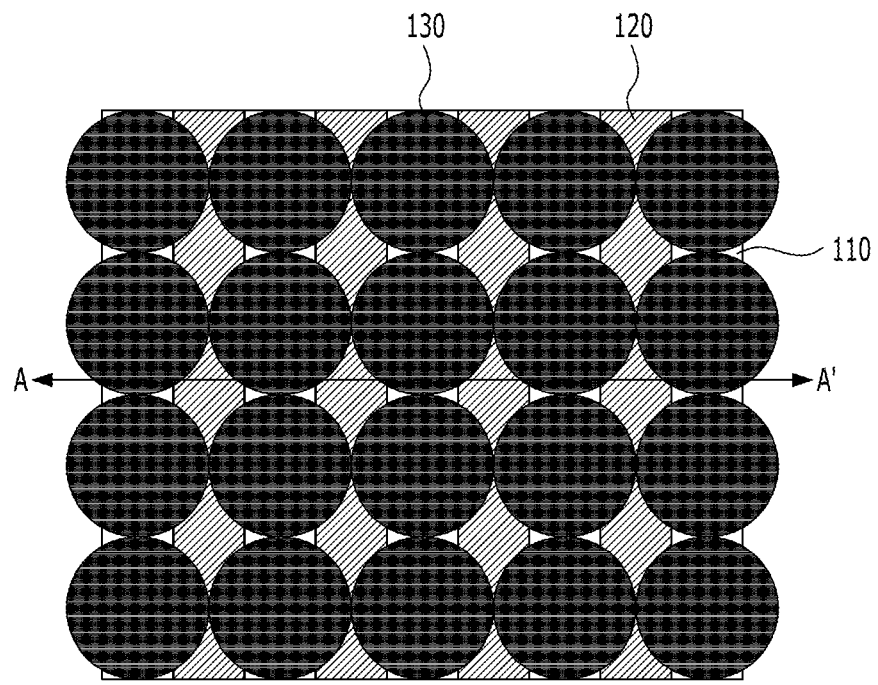
Figure 2B:
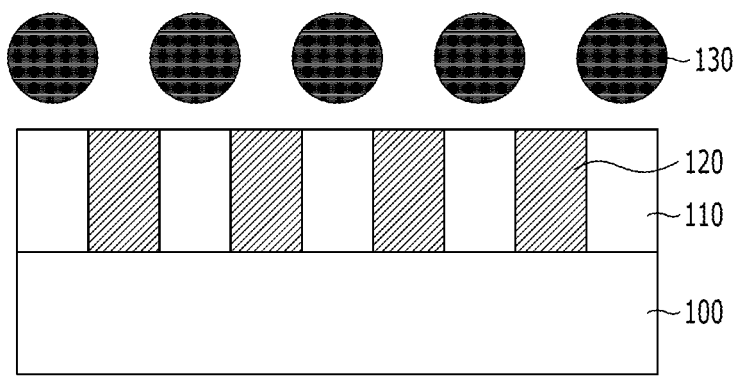

Referring to FIGS. 2A and 2B, hydrophilic particles 130 having at least a hydrophilic surface may be coated over the first insulation layer 110. In an embodiment, the hydrophilic particles 130 are formed so as to have a substantially spherical shape. The hydrophilic particles 130 may be applied as a unimolecular layer through a spin coating method.

In an embodiment, the hydrophilic particles 130 are self-aligned over the first insulation layer 110 based upon attractive or repulsive forces between different components of the semiconductor device. By "self-aligning" or "self-aligned," it is meant that no external application of energy or force is required to arrange the particles as desired, though it is understood that the application of an external force is not necessarily excluded. To self-align the hydrophilic particles 130 over the first insulation layer 130, repulsive forces act between the first lines 120 having a hydrophobic surface and the hydrophilic particles 130, and attractive forces act between the first insulation layer 110 having a hydrophilic surface and the hydrophilic particles 130. In the self-aligned position, the hydrophilic particles 130 are adjacent to one another along a first length of the first insulation layer 110 and also in a direction crossing the first length of the first insulation layer 110. In particular embodiments, the hydrophilic particles 130 are in contact with one another.

Thus, in an embodiment, first surfaces of the first lines 120 may be partially, but not completely, covered by the hydrophilic particles 130. In this way, the first lines 120 may also be exposed at predetermined intervals by the hydrophilic particles 130.

The hydrophilic particles 130 may comprise micelles or a hydrophilic polymer such as polyethylene oxide (PEO). In one embodiment, when the hydrophilic particles 130 comprise the micelles, the micelles may be formed as follows. An amphipathic material, such as a surfactant having a hydrophilic head and a hydrophobic tail, may be added to a hydrophilic solvent such as water or alcohol. Upon addition, the hydrophilic head is directed in one direction (e.g., a radially outward direction in a spherical micelle) by attraction with polar groups of the solvent molecules, and the hydrophobic tail is directed in the opposite direction (e.g., a radially inward direction in the spherical micelle) by repulsion with hydrophilic groups (portions) of the solvent molecules. Then, the hydrophilic heads and the hydrophobic tails are aggregated and thermodynamically stabilized to form a specific shape (e.g., the spherical shape). The resulting aggregate may be referred to as a micelle.

Figure 3A:
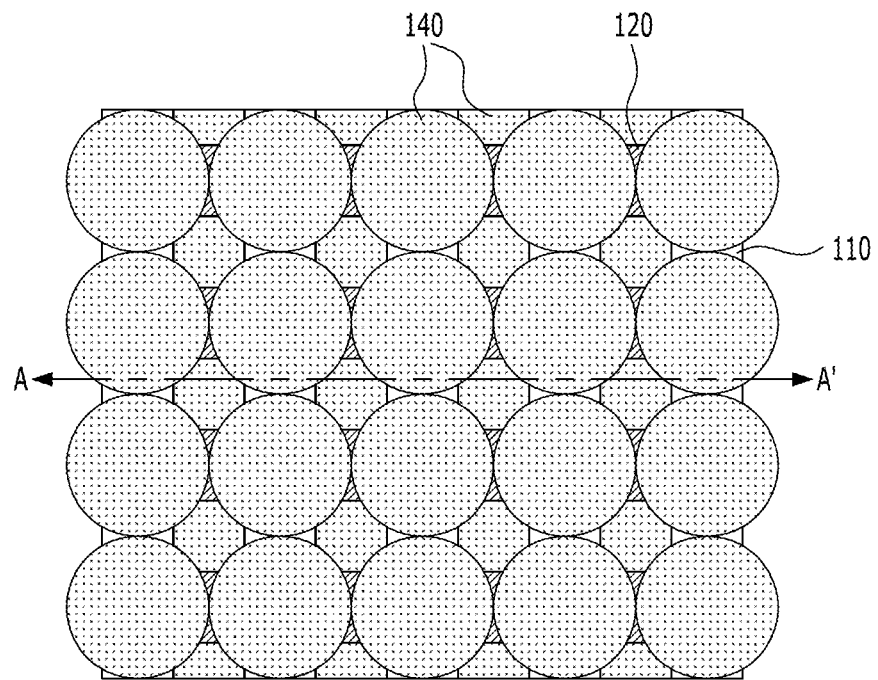
Figure 3B:
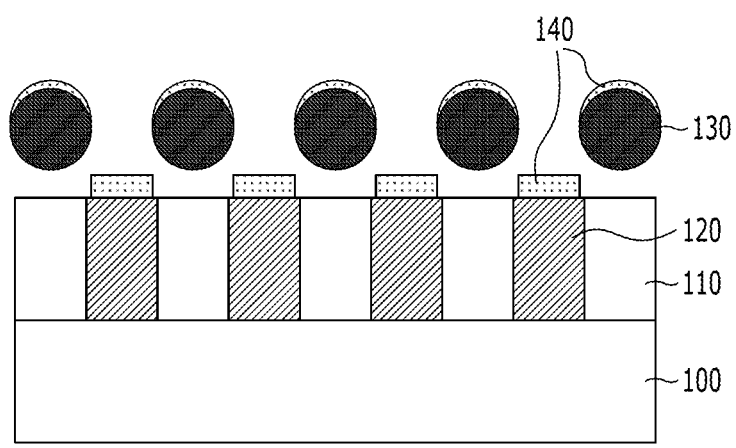

Referring to FIGS. 3A and 3B, a first material layer 140 is formed over the resultant structure having the hydrophilic particles 130 formed thereon, so that first material layer 140 is formed on the hydrophilic particles 130 and the first lines 120 exposed between the hydrophilic particles 130. The first material layer 140 may be deposited via a suitable deposition process as known in the art. In one embodiment, the first material layer 140 is deposited using a physical vapor deposition (PVD) process such as a sputtering process with poor step coverage. In this way, portions of the first material layer 140, which are deposited on the first lines 120 exposed between the hydrophilic particles 130, may be isolated from each other by the hydrophilic particles 130. The first material layer 140 comprises an electrode layer and may comprise, one or more of a metal such as Ta, Ti, Ru, Hf, Zr, Al, W, Cu, Au, Ag, Pt, Ni, Cr, or Co; a metal nitride such as TiN, TaN, or WN; doped silicon; or combinations thereof.

Figure 4A:
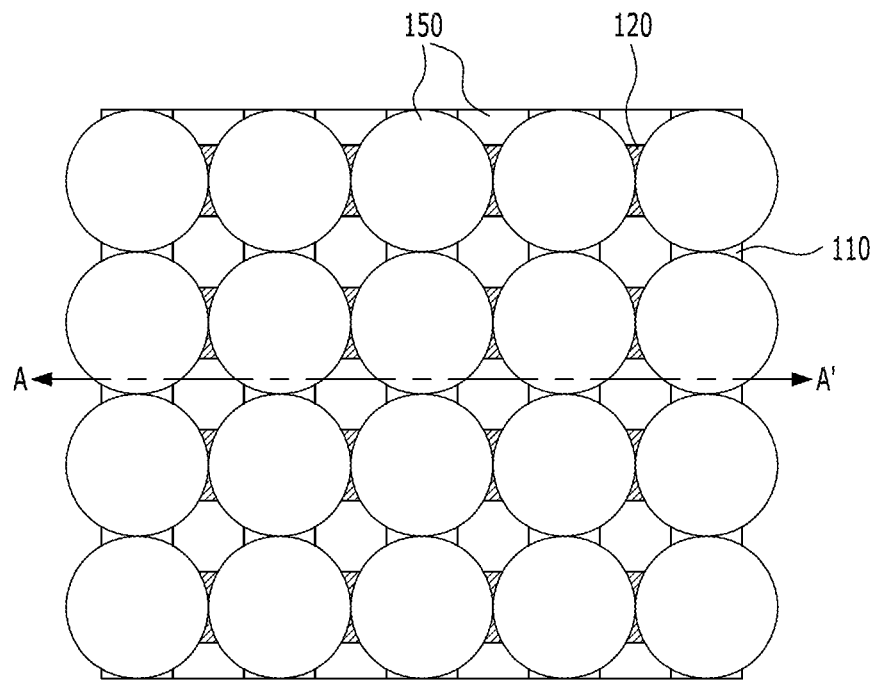
Figure 4B:
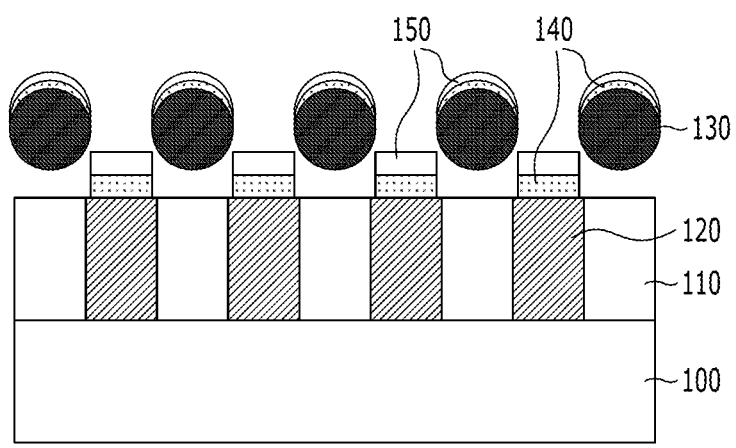

Referring to FIGS. 4A and 4B, a second material layer 150 is formed over the first material layer 140. The second material layer 150 may be deposited via a suitable deposition process as known in the art. In an embodiment, the second electrode layer 150 is deposited via a PVD process, such as a sputtering process with poor step coverage. In this way, portions of the second material layer 150, which are deposited over the first lines 120, may be isolated from each other by the hydrophilic particles 130.

The second material layer 150 comprises a variable resistance layer. The variable resistance layer may comprise a material whose resistance is changed via the migration of oxygen vacancies or ions. In another embodiment, the variable resistance layer comprises a material whose resistance is changed through a corresponding phase change.

The material whose resistance is changed through the migration of oxygen vacancies or ions may include a perovskite-based material such as STO ($SrTiO_3$), BTO ($BaTiO_3$), or PCMO ($Pr_{1-x}Ca_xMnO_3$) and/or a transition metal oxide (TMO) such as titanium oxide ($TiO_2$, $Ti_4O_7$), hafnium oxide ($HfO_2$), zirconium oxide ($ZrO_2$), aluminum oxide ($Al_2O_3$), tantalum oxide ($Ta_2O_5$), niobium oxide ($Nb_2O_5$), cobalt oxide ($Co_3O_4$), nickel oxide (NiO), tungsten oxide ($WO_3$), or lanthanum oxide ($La_2O_3$). The material whose electric resistance is changed through a phase change may include a material of which the state is changed between a crystalline state and an amorphous state by heat. Such materials include, for example, a chalcogenide-based material such as GST (GeSbTe) in which germanium, antimony, and tellurium are combined at a predetermined ratio.

Figure 5A:
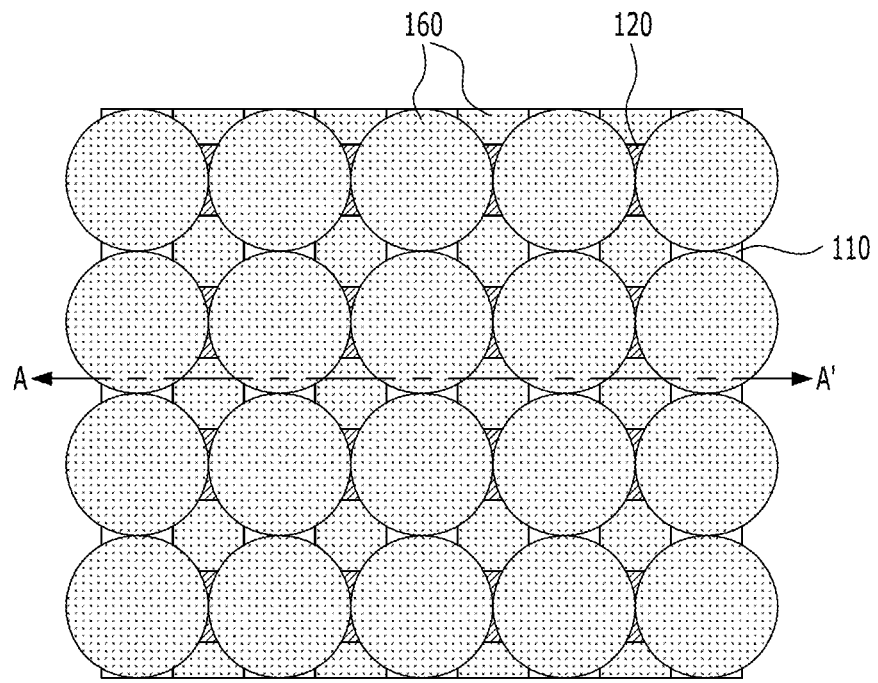
Figure 5B:
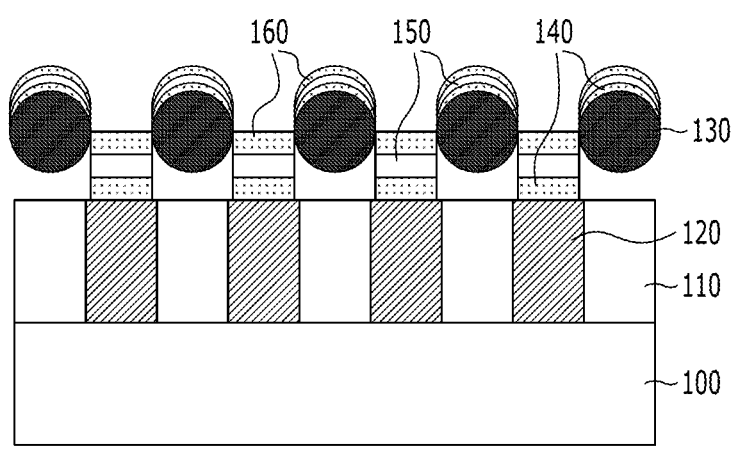

Referring to FIGS. 5A and 5B, a third material layer 160 is formed over the second material layer 150. The third material layer 160 may also be deposited via a suitable deposition as known in the art. For example, in an embodiment, the third material layer 160 is deposited through a PVD process such as a sputtering process with poor step coverage. As with layers 140 and 150, portions of the third material layer 160, which are deposited over the first lines 120 exposed between the hydrophilic particles 130, may be isolated from each other by the hydrophilic particles 130. The third material layer 160 may comprise one or more of a metal such as Ta, Ti, Ru, Hf, Zr, Al, W, Cu, Au, Ag, Pt, Ni, Cr, or Co; a metal nitride such as TiN, TaN, or WN; doped silicon; or combinations thereof.

Figure 6A:
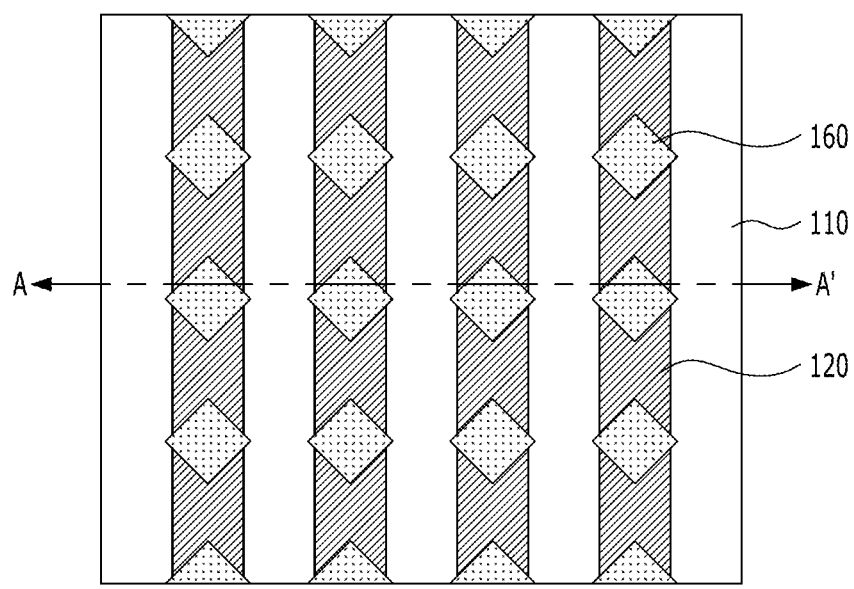
Figure 6B:
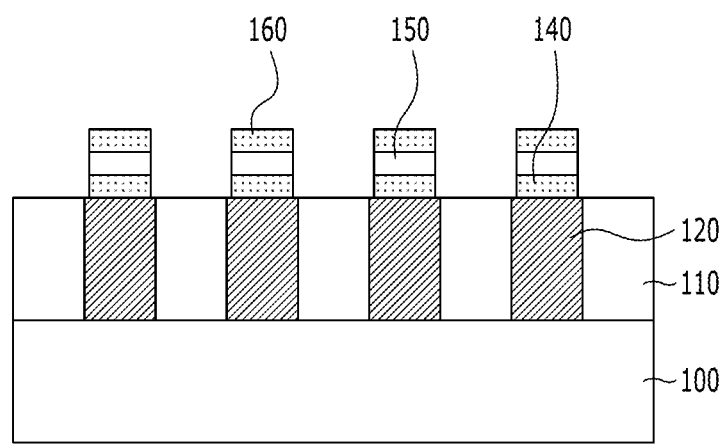

Referring to FIGS. 6A and 6B, after the third material layer 160 is formed, the hydrophilic particles 130 are removed by a suitable method. For example, the hydrophilic particles 130 may be removed via a heat treatment at a temperature of 300° C. or more or a via a lift-off process. In the resultant product, portions of the first to third material layers 140 to 160 deposited on the hydrophilic particles 130 are removed together with the hydrophilic particles 140. Further, as a result, a plurality of pillar-shaped structures in which the first to third material layers 140 to 160 are sequentially stacked and are left over the first lines 120. The pillar-shaped structures may each collectively constitute a variable resistance element which may switch between two or more different resistance states as the resistance thereof is changed in response to an applied voltage or current. In FIG. 6A, planar shapes of the pillar-shaped structures may correspond square shapes, but the present embodiment is not limited thereto. The pillar-shaped structures may have planar shapes similar to regions unmasked by the hydrophilic particles 130.

In an embodiment, the plurality of pillar-shaped structures may be arranged in the form of a matrix. In addition, in certain embodiments, the pillar-shaped structures may have a height equal to or less than the diameter of the hydrophilic particles 130, in order to prevent overhang of the pillar-shaped structures.

Figure 7A:
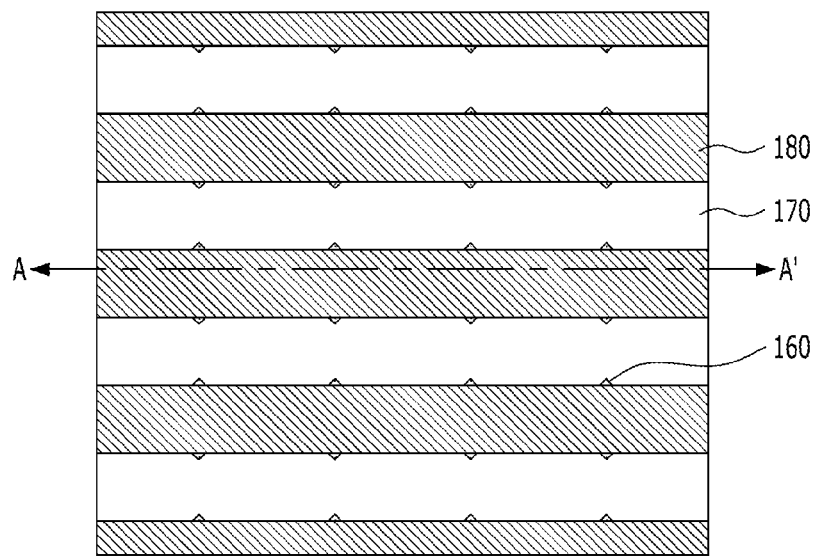
Figure 7B:
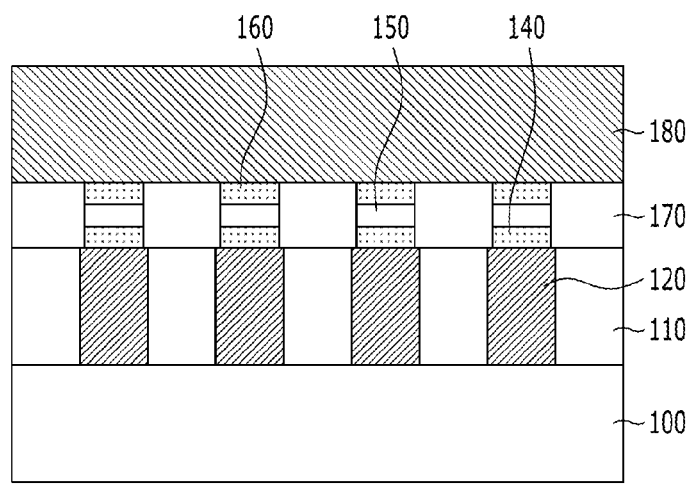

Referring to FIGS. 7A and 7B, after the removal step, a second insulation layer 170 is filled within the spaces between the pillar-shaped structures in which the first to third material layers 140 to 160 are stacked. The second insulation layer 170 may be formed by depositing an oxide or nitride-based material within the spaces.

Thereafter, second lines 180 are formed over a surface of the third material layers 160 and the second insulation layer 170. The second lines 180 may be formed by depositing a conductive material, for example, a metal such as Ta, Ti, Ru, Hf, Zr, Al, W, Cu, Au, Ag, Pt, Ni, Cr, or Co, or a metal nitride such as TiN, TaN, or WN. The second lines 180 are formed to extend parallel to one another in a direction crossing the first lines 120.

Figure 8A:
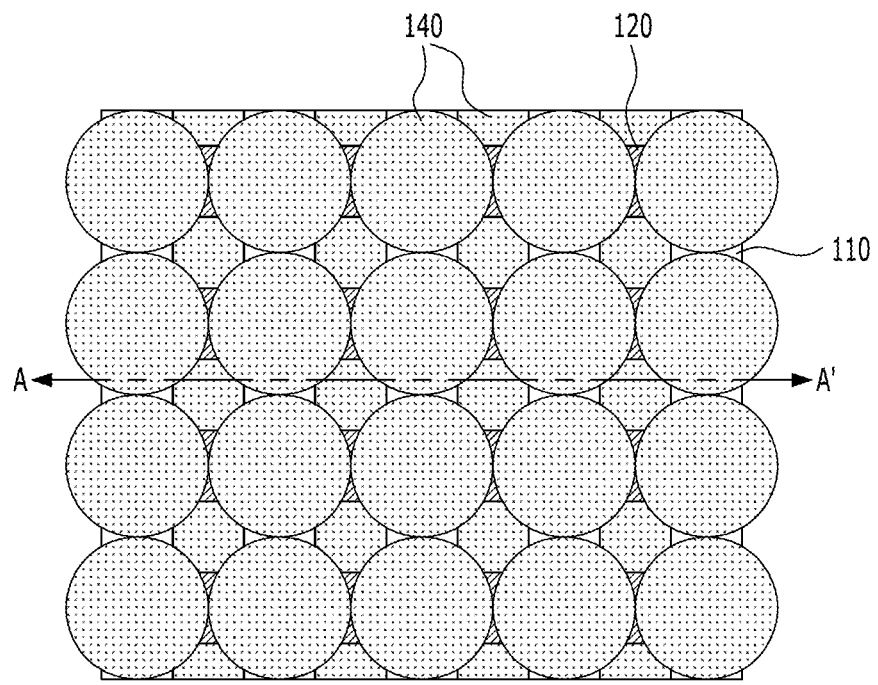
FIGS. 8A to 14B are diagrams illustrating a method for fabricating a semiconductor device in accordance with a second embodiment of the present invention.

Now referring to FIGS. 8A to 14B, FIGS. 8A to 14B illustrate a method for fabricating a semiconductor device in accordance with a second embodiment of the present invention. FIGS. 8A to 14A are plan views illustrating the layout, and FIGS. 8B to 14B are cross-sectional views taken along lines A-A' of FIGS. 8A to 14A, respectively. In this embodiment of the present invention, the detailed descriptions for forming the same elements as those of the first embodiment will be omitted for ease of description, but are understood to be applicable thereto. In this embodiment, first, the processes of FIGS. 1A and 1B are performed in the same manner as described for the first embodiment, and a process of FIGS. 8A and 8B is then performed as described below.

Figure 8B:
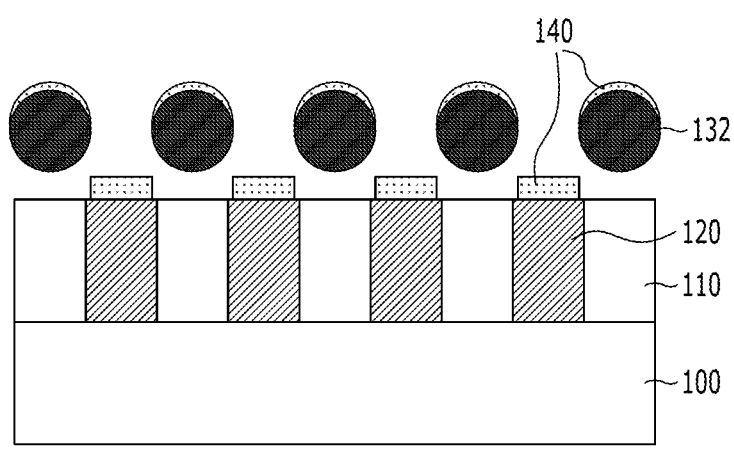

Referring to FIGS. 8A and 8B, first hydrophilic particles 132 having a hydrophilic surface are applied on the first insulation layer 110 and the first line 120. The first hydrophilic particles 132 may include micelles or a hydrophilic polymer such as PEO as described above. In addition, the first hydrophilic particles 132 may be formed in a substantially spherical shape and may be applied as a unimolecular layer through a spin coating method.

In an embodiment, the first hydrophilic particles 132 are self-aligned over the first insulation layer 110 based upon attractive or repulsive forces between different components of the semiconductor device as described above. In the self-aligned position, the first hydrophilic particles 132 are adjacent to one another along a first length of the first insulation layer 110 and in a direction crossing the first length of the first insulation layer 110. In particular embodiments, the first hydrophilic particles 132 are in contact with one another. In addition, first surfaces of the first lines 120 may be partially, but not completely, covered by the first hydrophilic particles 132. In this way also, the first lines 120 may also be exposed at predetermined intervals by the first hydrophilic particles 132.

Thereafter, a first material layer 140 is formed over the resultant structure as described above having the first hydrophilic particles 132 formed thereon, so that first material layer 140 is formed on the first hydrophilic particles 132 and the first lines 120 exposed between the first hydrophilic particles 132. The first material layer 140 may be deposited via a suitable deposition process as known in the art. In an embodiment, the first material layer 140 is deposited using a PVD process such as a sputtering process with poor step coverage. In this way, portions of the first material layer 140, which are deposited on the first lines 120 exposed between the first hydrophilic particles 132, may be isolated from each other by the first hydrophilic particles 132. The first material layer 140 is an electrode layer and may comprise one or more of a metal, a metal oxide, and doped silicon as described above.

Figure 9A:
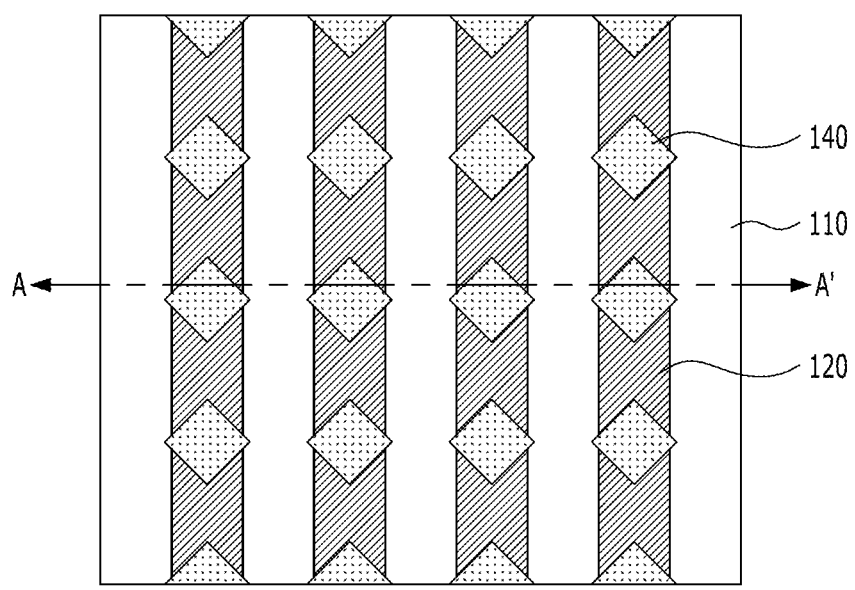
Figure 9B:
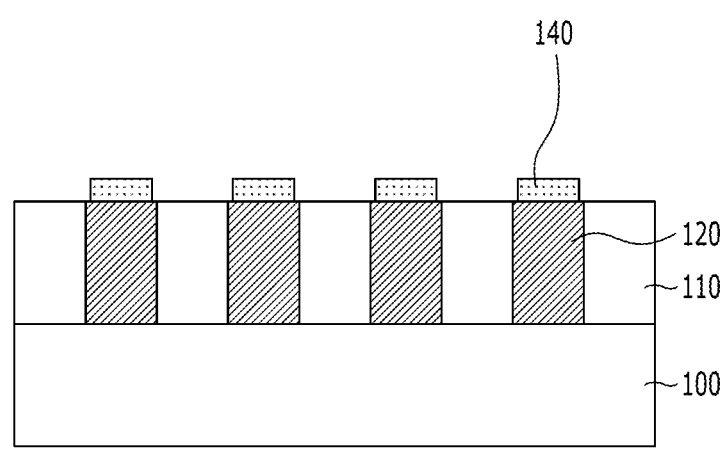

Referring to FIGS. 9A and 9B, after the first material layer 140 is formed, the first hydrophilic particles 132 may be removed by a suitable method. For example, the first hydrophilic particles 132 may be removed via heat treatment at a temperature of 300° C. or more, or via a lift-off process. In the resultant product, portions of the first material layer 140, which are deposited over the first hydrophilic particles 132, may be removed together with the first hydrophilic particles 132. Further, as a result, portions of the first material layer 140 formed over the first lines 120 may be left. In an embodiment, the remaining portions of the first material layer 140 may be arranged in the form of a matrix.

Figure 10A:
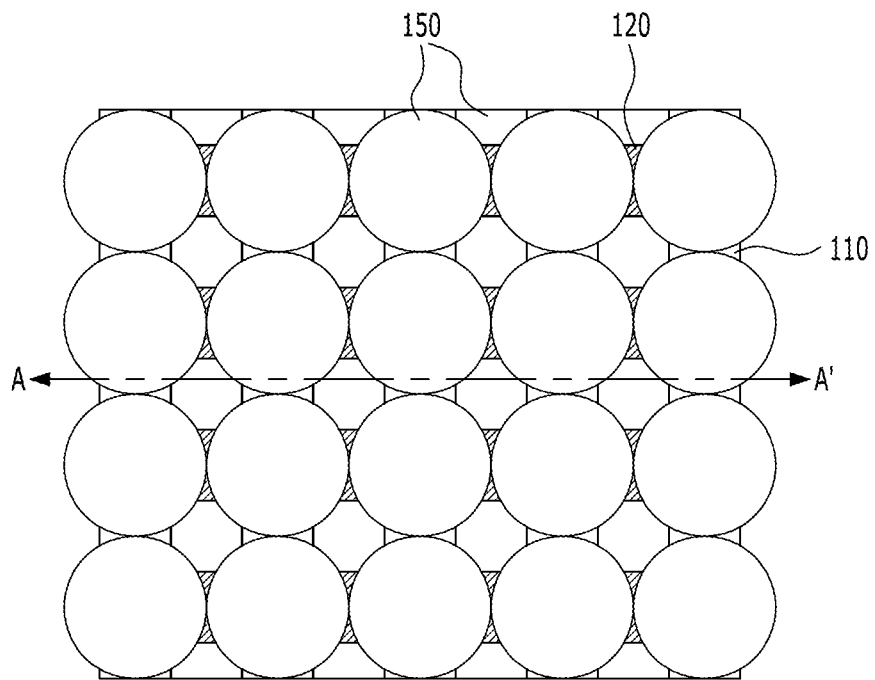
Figure 10B:
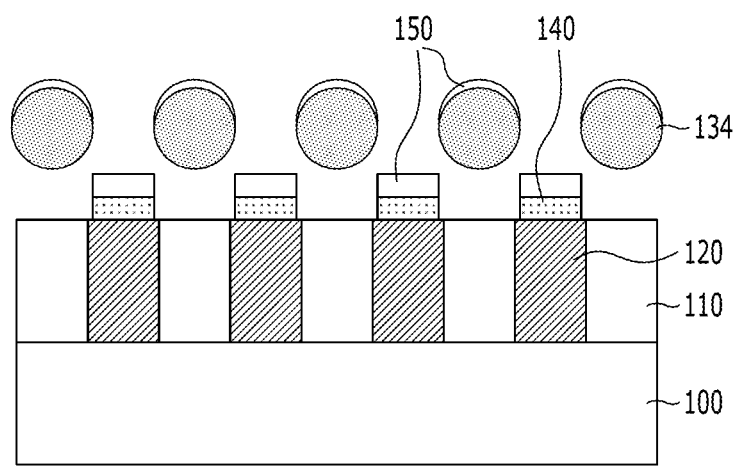

Referring to now FIGS. 10A and 10B, after removal of the first hydrophilic particles 132, second hydrophilic particles 134 having a hydrophilic surface may be applied over the first insulation layer 110 and the first lines 120. Similar to the first hydrophilic particles 132, the second hydrophilic particles 134 may include micelles or a hydrophilic polymer such as PEO. The second hydrophilic particles 134 may also have a substantially spherical shape, and may be applied as a unimolecular layer through a spin coating method.

As a level difference (e.g., height difference) occurs due to the first material layer 140, the second hydrophilic particles 134 may be self-aligned over the first insulation layer 110 from which the first hydrophilic particles 132 were removed. Similar to the first hydrophilic particles 132, the second hydrophilic particles 134 may be disposed adjacent to one another along a first length of the first insulation layer 110 and in a direction crossing the first length of the first insulation layer 110 In particular embodiments, the second hydrophilic particles 134 are in contact with one another. In addition, first surfaces of the first lines 120, may be partially, but not completely, covered by the second hydrophilic particles 134. In this way, the first lines 120 may also be exposed at predetermined intervals by the second hydrophilic particles 134.

Thereafter, a second material layer 150 is formed over the resultant structure in which the second hydrophilic particles 134 are coated. The second material layer 150 may be deposited via a suitable deposition process known in the art. In an embodiment, the deposition process is a PVD process such as a sputtering process with poor step coverage. In this way, portions of the second material layer 150, which are deposited over the first material layer 140 exposed between the second hydrophilic particles 134, may be isolated from each other by the second hydrophilic particles 134. As indicated above, the second material layer 150 is a variable resistance layer that includes a material whose electrical resistance is changed through migration of oxygen vacancies or ions, or alternatively, may comprise a material whose electrical resistance may be changed through a corresponding phase change.

Figure 11A:
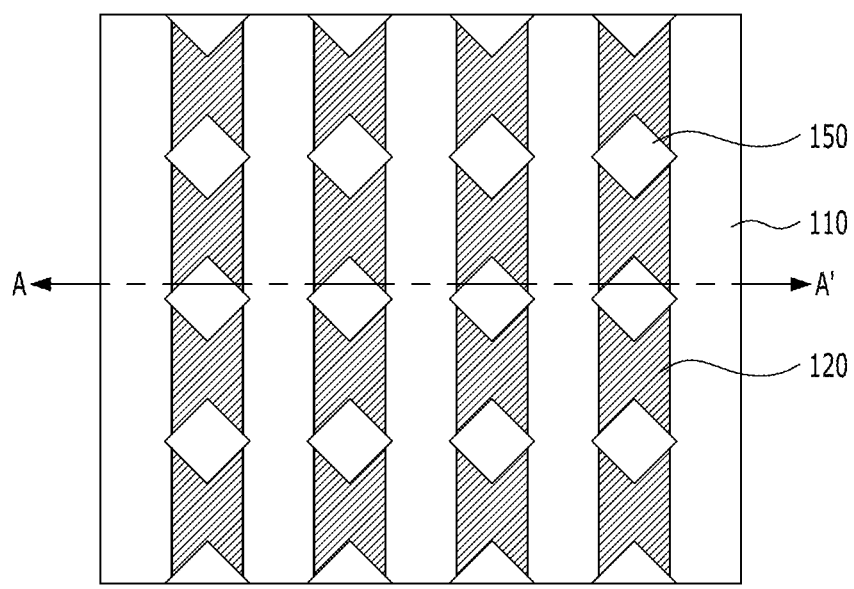
Figure 11B:
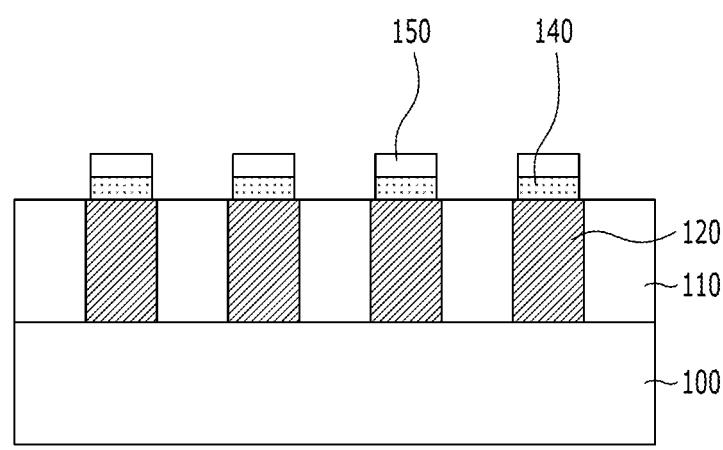
Figure 12A:
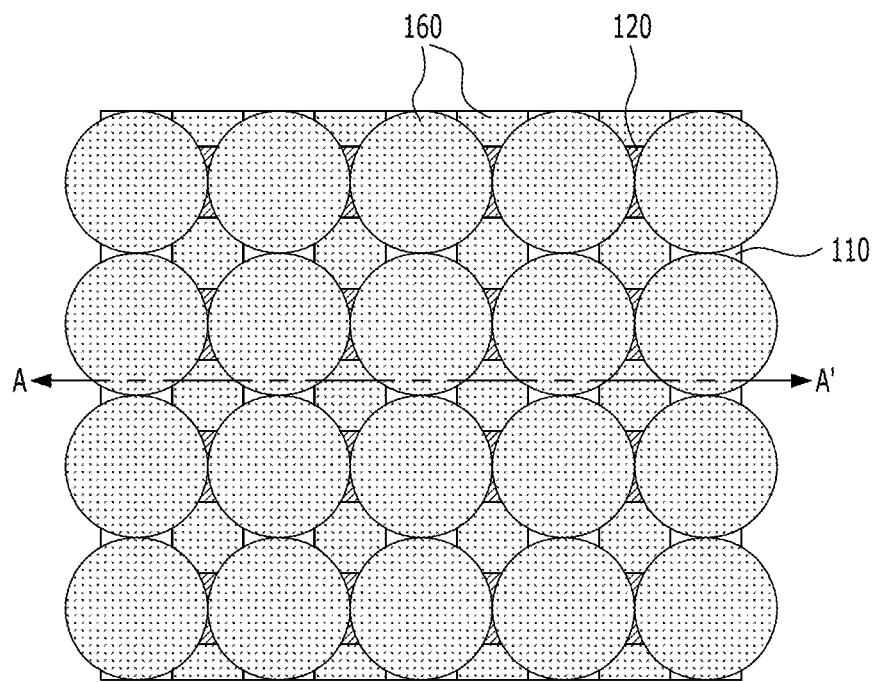
Figure 12B:
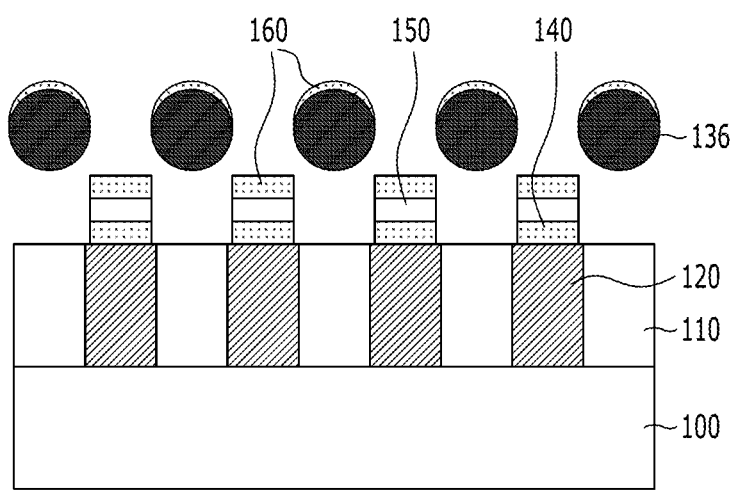

Referring to FIGS. 11A and 11B, after the second material layer 150 is deposited, the second hydrophilic particles 134 may be removed by a suitable removal process. For example, the second hydrophilic particles 134 may be removed via a heat treatment at a temperature of 300° C. or more or via a lift-off process. In this way, portions of the second material layer 150 deposited over the second hydrophilic particles 134 are also removed together with the second hydrophilic particles 134. As a result of the removal process, portions of the second material layer 150 formed over the first material layer 140 may be left in substantially the same pattern as the first material layer 140.

Referring to 12A and 12B, third hydrophilic particles 136 are applied over the first insulation layer 110 and the first lines 120. Similar to the first hydrophilic particles 132 and the second hydrophilic particles 134, the third hydrophilic particles 136 may comprise micelles or a hydrophilic polymer such as PEO. In addition, the third hydrophilic particles 136 may also have a substantially spherical shape, and may be applied as a unimolecular layer through a spin coating method. In an embodiment, as a level difference (e.g., height difference) occurs due to the first and second material layers 140 and 150, the third hydrophilic particles 136 may be self-aligned (as described herein) over the first insulation layer 110 where the second hydrophilic particles 134 were removed. Similar to the first hydrophilic particles 132 and the second hydrophilic particles 134, the third hydrophilic particles 136 may be disposed adjacent to one another along the first length of the first insulation layer 110 and in a direction crossing the first length of the first insulation layer 110. In particular embodiments, the third hydrophilic particles 136 are in contact with one another. Thereafter, a third material layer 160 is formed over the resultant structure having the applied third hydrophilic particles 136. The third material layer 160 may be deposited via any suitable process known in the art. In an embodiment, the third material layer 160 is deposited via a PVD process such as a sputtering process with poor step coverage. Thus, portions of the third material layer 160, which are deposited over the second material layer 150 exposed between the third hydrophilic particles 136, may be isolated from each other by the third hydrophilic particles 136. The third material layer 160 is an electrode layer and may include one or more of metal, metal nitride, and doped silicon.

Figure 13A:
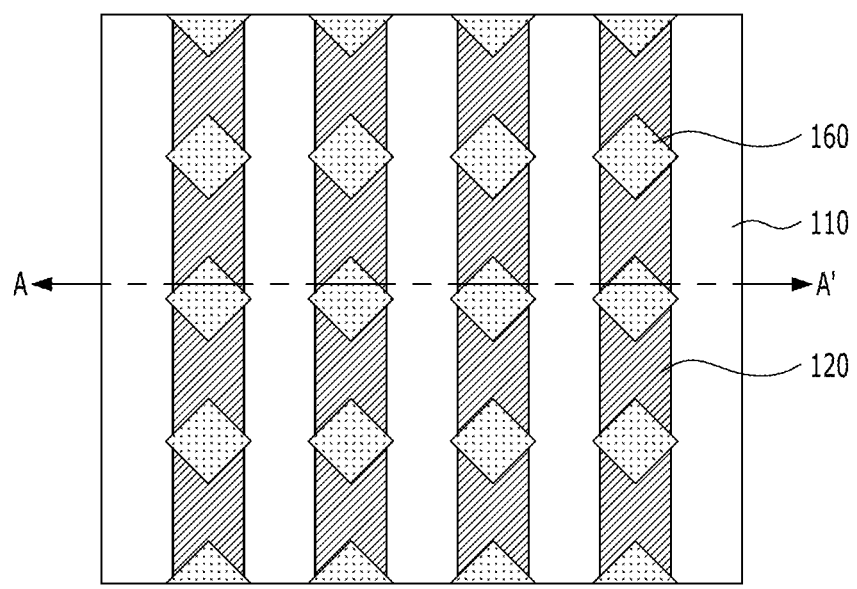
Figure 13B:
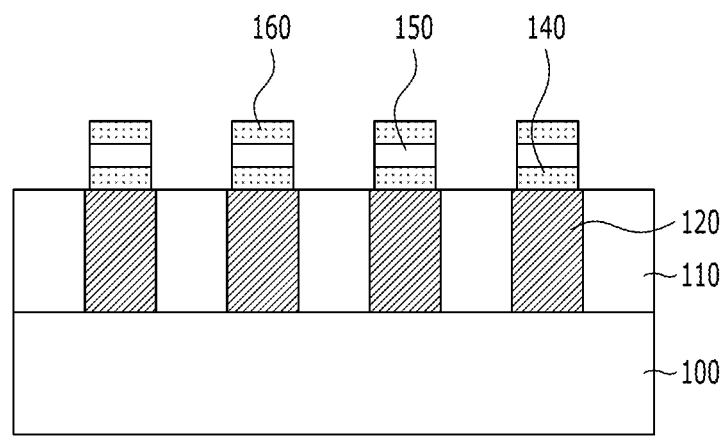

Referring to FIGS. 13A and 13B, as with the first hydrophilic particles 132 and the second hydrophilic particles 134, the third hydrophilic particles 136 may be removed via any suitable removal process known in the art. In an embodiment, the third hydrophilic particles 136 are removed via heat treatment at a temperature of 300° C. or via a lift-off process. In this way, portions of the third material layer 160 deposited over the third hydrophilic particles 136 may be removed together with the third hydrophilic particles 136. As a result of this process also, the third material layer 160 may be left over the second material layer 150 in substantially the same pattern as the first material layer 140 and the second material layer 150. The first to third material layers 140 to 160 stacked over the first lines 120 may collectively constitute a variable resistance element as shown in FIG. 13B.

Figure 14A:
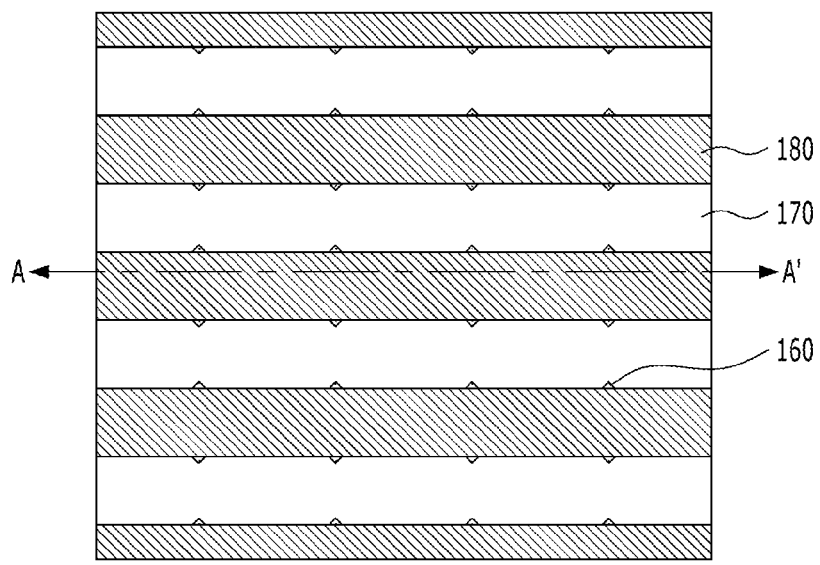
Figure 14B:
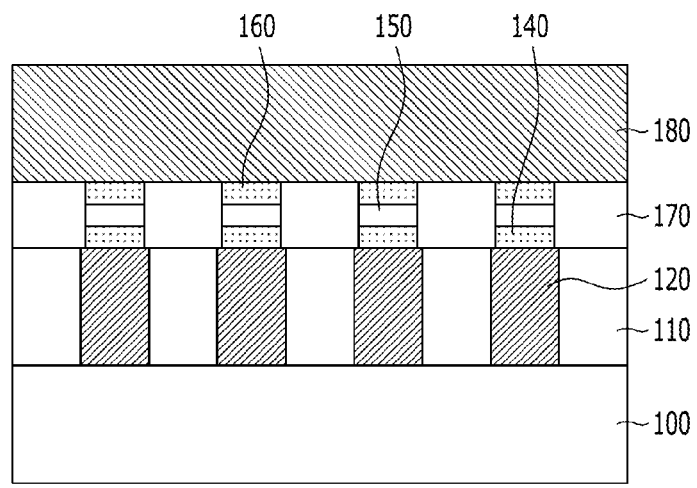

Referring to FIGS. 14A and 14B, a second insulation layer 170 is formed to fill a space between the structures in which the first to third material layers 140 to 160 (variable resistance elements) are stacked. The second insulation layer 170 may be formed by depositing an oxide or nitride-based material.

Thereafter, as is also shown in FIGS. 14A and 14B, second lines 180 are formed on a surface of the third material layer 160 and the second insulation layer 170. The second lines 180 may be formed by depositing a conductive material, for example, a metal or metal nitride over the third material layer 160 and the second insulation layer 170. The second lines 180 may extend parallel to one another in a direction crossing the first lines 120.

In the second embodiment of the present invention, the hydrophilic particles serve as a mask to more effectively prevent overhang from being formed during the deposition.

Figure 15A:
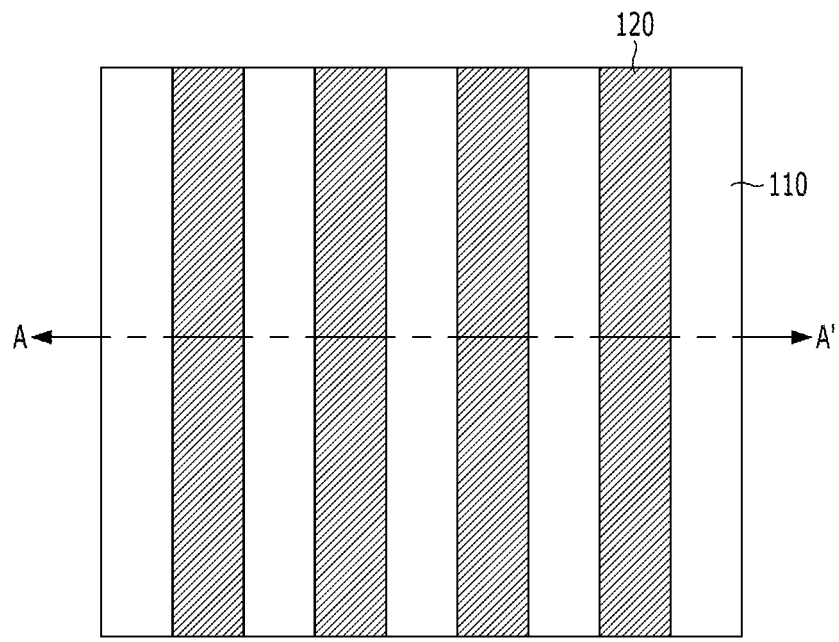
FIGS. 15A to 16B are diagrams illustrating a method for fabricating a semiconductor device in accordance with a third embodiment of the present invention.
Figure 15B:
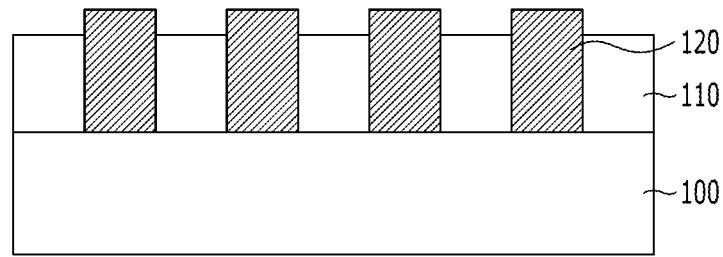
Figure 16A:
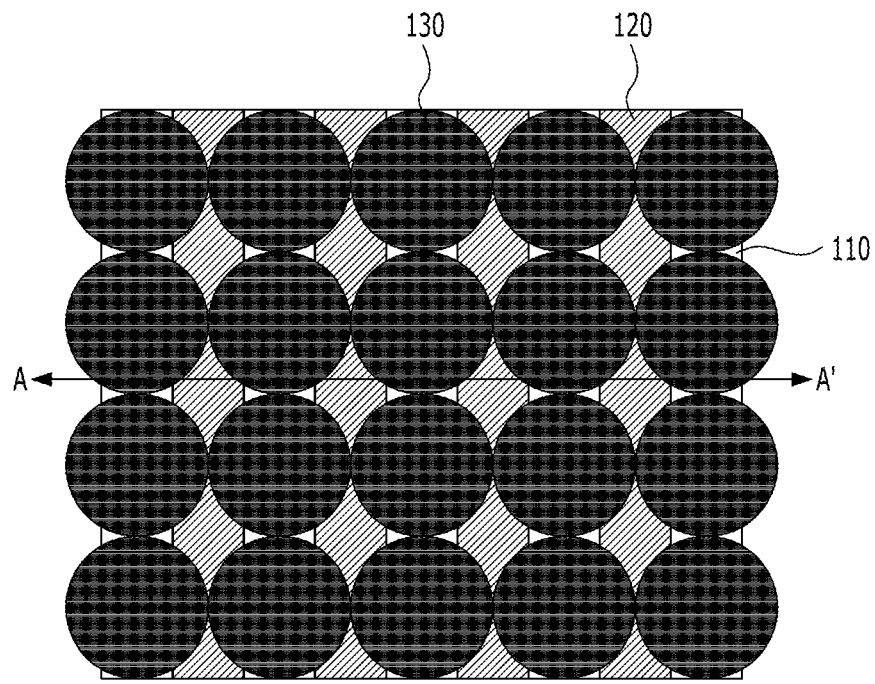
Figure 16B:
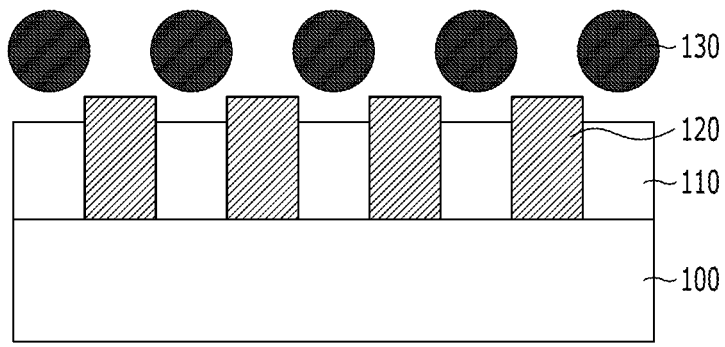

FIGS. 15A to 16B are diagrams illustrating a method for fabricating a semiconductor device in accordance with a third embodiment of the present invention. FIGS. 15A and 16A are plan views illustrating the layout, and FIGS. 15B and 16B are cross-sectional views taken along lines A-A' of FIGS. 15A and 15A, respectively. In this embodiment of the present invention, the detailed descriptions for forming the same components as those of the above embodiments are omitted, but are understood to be applicable thereto.

Referring to FIGS. 15A and 15B, a first insulation layer 110 is formed, and a plurality of first lines 120 extend parallel to each other in one direction within trenches formed by etching the first insulation layer 110 as described above. The first insulation layer 110 and first lines 120 are formed over a substrate 100 having a predetermined lower structure (not illustrated) such as a peripheral circuit for driving the semiconductor device. The substrate 100 may comprise a silicon substrate, a germanium substrate, a silicon-germanium substrate, or an SOI substrate. The first insulation layer 110 may be formed by depositing an oxide-based material having a hydrophilic surface as described above. The first lines 120 are formed of a conductive material having a hydrophilic surface, and may be formed by depositing a metal or metal nitride.

Thereafter, in this embodiment, an etch-back process is performed to partially remove top portions of the first insulation layer 110. The first insulation layer 110 may be recessed to a depth of 1 nm to 5 nm. Thus, as the top surface of the first insulation layer 110 is set at a lower level than the top surface of a respective first line 120, a level difference (e.g., height difference) may occur between the first insulation layer 110 and the respective first line 120.

Referring to FIGS. 16A and 16B, hydrophilic particles 130 as described herein are applied over the first insulation layer 110 and the first lines 120. In this embodiment, the hydrophilic particles 130 may be self-aligned over the first insulation layer 110 having a hydrophilic surface by repulsion between the hydrophilic particles 130 and the hydrophobic first lines 120 and attractive forces between the hydrophilic particles 130 and the hydrophilic surface of the first insulation layer 110. The hydrophilic particles 130 may be disposed adjacent to one another along a first length of the first insulation layer 110 is and in a direction crossing the first length of the first insulation layer 110. Thereafter, subsequent processes may be performed in the same manner as the first and second embodiments.

In the third embodiment of the present invention, as the insulation layers, e.g., the first insulation layer 110, between the lines, e.g., the first lines 120, are recessed, the hydrophilic particles serve as a mask and may be more reliably aligned over the first insulation layer 110.

Figure 17:
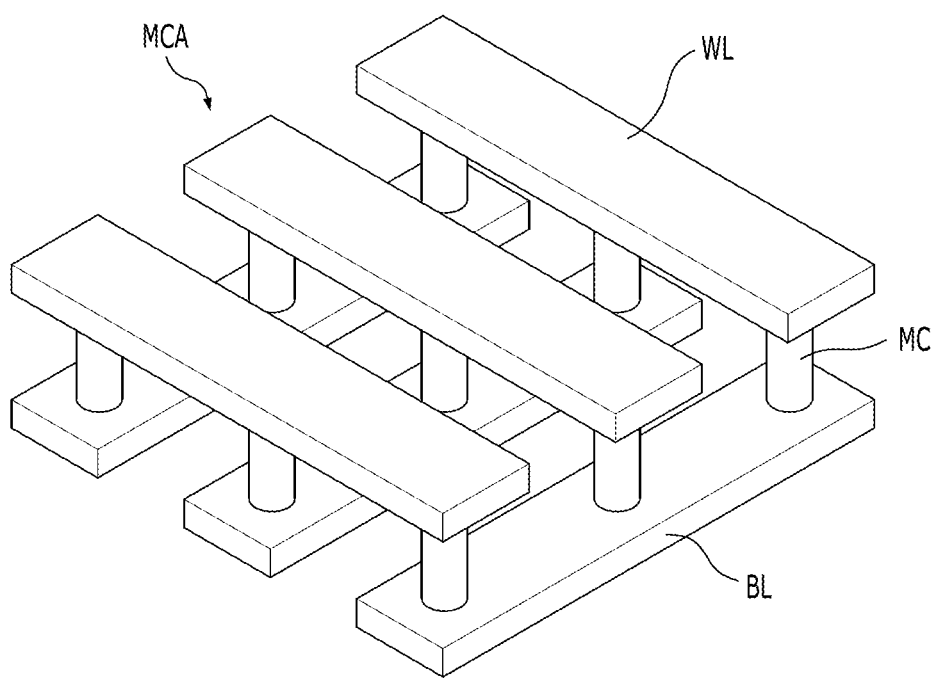
FIG. 17 is a perspective view of a memory cell array MCA of a semiconductor device in accordance with an embodiment of the present invention.

FIG. 17 is a perspective view of a memory cell array MCA of a semiconductor device in accordance with an embodiment of the present invention.

Referring to FIG. 17, the semiconductor device in accordance with the embodiment of the present invention includes a cross point cell array including a plurality of bit lines BL extending in parallel to each other in one direction, a plurality of word lines WL isolated from the bit lines BL and extending in parallel to each other in a direction crossing the bit lines BL, and a plurality of memory cells MC arranged at the respective intersections between the bit lines BL and the word lines WL. The memory cell MC may include a variable resistance layer which may switch between two or more different resistance states as the resistance thereof is changed according to an applied voltage or current.

Figure 18:
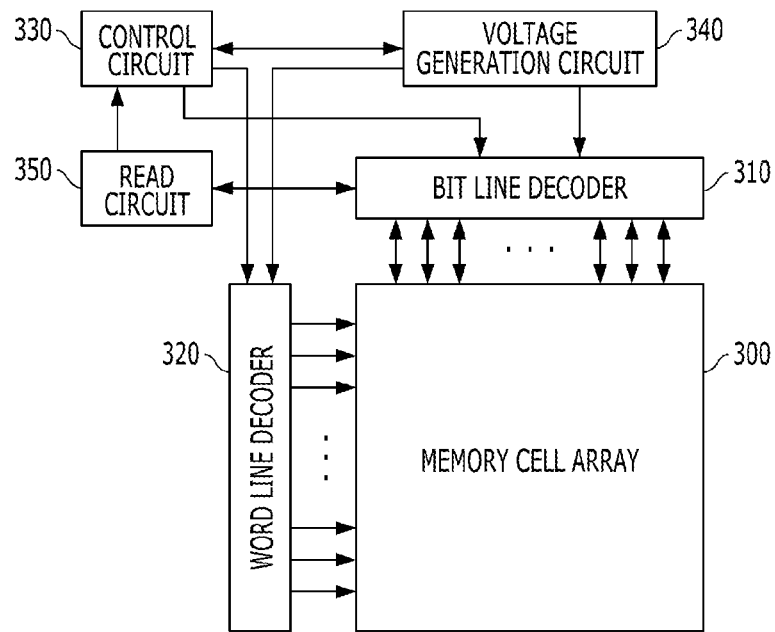
FIG. 18 is a configuration diagram of a semiconductor device in accordance with an embodiment of the present invention.

FIG. 18 is a configuration diagram of a semiconductor device in accordance with an embodiment of the present invention.

Referring to FIG. 18, a memory cell array 300 includes a plurality of memory cells arranged in a matrix shape, and a bit line decoder 310, a word line decoder 320, a control circuit 330, a voltage generation circuit 340, and a read circuit 350 may be disposed around the memory cell array 300.

The bit line decoder 310 is connected to bit lines of the memory cell array 300, and configured to select a bit line corresponding to an address signal. Similarly, the word line decoder 320 is connected to word lines of the memory cell array 300, and configured to select a word line corresponding to the address signal. That is, a specific memory cell may be selected in the memory cell array 300 through the bit line decoder 310 and the word line decoder 320.

The control circuit 330 is configured to control the bit line decoder 310, the word line decoder 320, and the voltage generation circuit 340 based on the address signal, a control input signal, and a data input during a write operation. In particular, the control circuit 330 controls the write, erase, and read operations for the memory cell array 300. The control circuit 330 may perform functions of an address buffer circuit, a data input/output buffer circuit, and a control input buffer circuit.

The voltage generation circuit 340 is configured to generate a voltage required during the write, erase, or read operation for the memory cell array 300 and supply the generated voltage to a bit line and a word line. The read circuit 350 is configured to sense the resistance state of the selected memory cell to determine data stored in the memory cell, and transmit the determination result to the control circuit 330.

Figure 19:
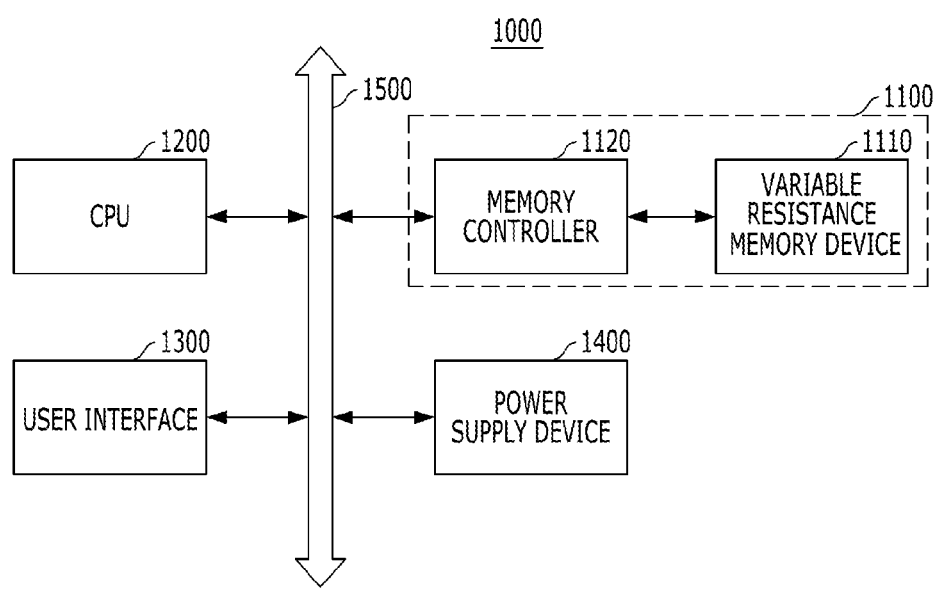
FIG. 19 is a configuration diagram of an electronic device including a semiconductor device in accordance with an embodiment of the present invention.

FIG. 19 is a configuration diagram of an electronic device including the semiconductor device in accordance with an embodiment of the present invention.

Referring to FIG. 19, the electronic device 1000 including the semiconductor device in accordance with this embodiment of the present invention may include a data storage system 1100, a CPU 1200, a user interface 1300, and a power supply device 1400 to supply power required for operations of the data storage system 1100, the CPU 1200, and the user interface 1300. The data storage system 1100, the CPU 1200, the user interface 1300, and the power supply device 1400 may perform data communication with each other through a bus 1500. The electronic device 1000 may input, process, output, transmit/receive, and store data, and may include a computer, a server, a tablet personal computer (PC), a portable computer, a personal digital assistant (PDA), a wireless phone, a mobile phone, a smart phone, a digital music player, a portable multimedia player (PMP), a camera, a global positioning system (GPS), a video camera, a voice recorder, telematics, an audio visual (AV) system, a smart TV and the like.

The data storage system 1100 for storing data may include a variable resistance memory device 1110 and a memory controller 1120. The variable resistance memory device 1110 is configured to retain data stored therein regardless of power supply, and the memory controller 1120 is configured to control input/output of the data stored in the variable resistance memory device 1110 according to a command inputted from outside. The data storage system 1100 may include a hard disk drive (HDD), a solid state drive (SSD), a universal serial bus (USB) memory, a secure digital (SD) card, a mini SD card, a micro SD card, a secure digital high capacity (SDHC) card, a memory stick, a compact flash (CF) card, a smart media (SM) card, a multi-media card (MMC), an embedded MMC (eMMC) and the like.

The variable resistance memory device 1110 may store data processed by the CPU 1200 or data inputted from outside through the user interface 1300, and may include any one of the semiconductor devices which are fabricated in accordance with the above-described embodiments of the present invention. The memory controller 1120 is configured to control data exchange between the variable resistance memory device 1110 and the user interface 1300 according to a command analyzed by the CPU 1200.

The CPU 1200 may analyze a command inputted through the user interface 1300, and calculate and compare data stored in the data storage system 1100. The CPU 1200 may include a micro process unit (MPU), a single/multi core processor, an application processor (AP), a graphic processing unit (GPU), a digital signal processor (DSP) and the like.

The user interface 1300 is configured to exchange commands and data between the electronic device 100 and external devices, and may include a keypad, a keyboard, a mouse, a speaker, a mike, various display devices, various human interface devices (HID) or a communication device. The communication device may include a module connectable to a wired network or a module connectable to a wireless network.

The module connectable to a wired network may include a local area network (LAN), a universal serial bus (USB), Ethernet, power line communication (PLC), and the module connectable to a wireless network may include infrared data association (IrDA), code division multiple access (CDMA), time division multiple access (TDMA), frequency division multiple access (FDMA), wireless LAN, wireless broadband Internet (WiBro), ubiquitous sensor network (USN), radio frequency identification (RFID), near field communication (NFC), Zigbee, Bluetooth, long term evolution (LTE), high speed downlink packet access (HSDPA), wideband CDMA (WCDMA), ultra wideband (UWB) and the like.

In accordance with the embodiments of the present invention, micro patterns may be formed without a photolithography process and an etch process. Thus, the fabrication process may be simplified, and the fabrication cost may be reduced. Furthermore, etch damage may be fundamentally prevented.

Although various embodiments have been described for illustrative purposes, it will be apparent to those skilled in the art that various changes and modifications may be made without departing from the spirit and scope of the invention as defined in the following claims.

What is claimed is:

1. A method for fabricating a semiconductor device, the method comprising:

forming first lines having a hydrophobic surface extending parallel to each other in a direction between first insulation layers having a hydrophilic surface;

self-aligning first hydrophilic particles over the first insulation layers to expose portions the first lines at predetermined intervals;

forming a first material layer over the exposed portions of the first lines; and removing the first hydrophilic particles to leave the first material layer over the exposed portions of the first lines.

2. The method of claim 1, further comprising partially removing top portions of the insulation layers, after the forming of the first lines.

3. The method of claim 1, further comprising: self-aligning second hydrophilic particles over the first insulation layers where the first hydrophilic particles were removed; forming a second material layer over the first material layer; and removing the second hydrophilic particles to leave the second material layer over the first material layer.

4. The method of claim 3, further comprising:

self-aligning third hydrophilic particles over the first insulation layers where the second hydrophilic particles were removed;

forming a third material layer over the second material layer; and removing the third hydrophilic particles to leave the third material layer over the first and second material layers, the first, second, and third material layers forming a plurality of variable resistance elements.

5. The method of claim 4, wherein at least one of the first, second, or third hydrophilic particles comprise micelles or a hydrophilic polymer.

6. The method of claim 4, wherein at least one of the first, second, or third hydrophilic particles have a spherical shape.

7. The method of claim 4, wherein after coating thereof, the first, second, or third hydrophilic particles are in contact with one another.

8. The method of claim 4, where each of the first and third material layers comprises an electrode layer, and the second material layer comprises a variable resistance layer.

9. The method of claim 4, wherein the first, second, or third material layer is deposited via PVD.

10. The method of claim 4, wherein the removing of the first, second, or third hydrophilic particles comprises performing a heat treatment or a lift-off process.

11. The method of claim 4, further comprising:

forming a second insulation layer between the plurality of variable resistance elements, after the removing of the third hydrophilic particles; and forming second lines extending parallel to one another in a direction crossing the first lines and contacting the third material layer and portions of the second insulation layer.

* * * * *